(12) United States Patent
Nazarian

(10) Patent No.: US 8,299,559 B2
(45) Date of Patent: Oct. 30, 2012

(54) RE-CONFIGURABLE MIXED-MODE INTEGRATED CIRCUIT ARCHITECTURE

(76) Inventor: Hagop Nazarian, San Jose, CA (US)

( * ) Notice: Subject to any disclaimer, the term of this patent is extended or adjusted under 35 U.S.C. 154(b) by 595 days.

(21) Appl. No.: 11/475,821

(22) Filed: Jun. 27, 2006

(65) Prior Publication Data

US 2006/0238955 A1 Oct. 26, 2006

(51) Int. Cl.
*G01P 1/10* (2006.01)

(52) U.S. Cl. .......... 257/499; 257/E27.108; 257/E23.46; 326/37

(58) Field of Classification Search .................. 257/499, 257/210, 211, 530, E23.46, E27.108; 361/239; 341/110, 160; 307/465; 326/37, 38, 41, 326/47
See application file for complete search history.

(56) References Cited

U.S. PATENT DOCUMENTS

| | | | | |
|---|---|---|---|---|
| 5,107,146 A * | 4/1992 | El-Ayat | ........................ | 326/41 |
| 5,959,871 A * | 9/1999 | Pierzchala et al. | ................ | 703/4 |
| 8,111,097 B1 * | 2/2012 | Kutz et al. | ........................ | 330/9 |
| 2002/0186074 A1* | 12/2002 | Gorecki et al. | ................ | 327/554 |
| 2004/0167736 A1* | 8/2004 | Blake et al. | ................ | 702/107 |
| 2012/0086471 A1* | 4/2012 | Snyder et al. | ................... | 326/38 |

* cited by examiner

*Primary Examiner* — Minh-Loan T Tran
*Assistant Examiner* — Fazli Erdem

(57) ABSTRACT

An analog portion of a mixed-mode integrated circuit system includes a plurality of analog input cells, a plurality of analog output cells, and an interconnect array. The input cells are configured to program analog functions. The output cells are configured to provide Analog and digital outputs corresponding to the programmed analog functions. The interconnect array processes the programmed analog functions into signals indicative of the analog functions. The interconnect array selectively provides the signals to the plurality of analog output cells.

19 Claims, 4 Drawing Sheets

RE-CONFIGURABLE MIXED-MODE INTEGRATED CIRCUIT ARCHITECTURE

FIELD OF THE INVENTION

This invention relates generally to integrated circuit architecture, and more particularly to a re-configurable integratted circuit architecture that uses analog and digital building blocks to build a mixed-mode integrated system.

BACKGROUND

Mixed mode electronic systems that use analog and digital building blocks in the industry may use programmable logic devices (PLD), complex programmable logic devices (CPLD), and/or field programmable gate arrays (FPGA) to implement the digital functional portion of the mixed mode electronic system by programming the configuration switches in the programmable devices. However, the analog functions of the mixed mode electronic system, which are interfacing, controlling or being controlled by the digital functions, usually are specific and are not re-configurable. Moreover, these analog functions are not suitable to be integrated on the same silicon with digital programmable devices because of the noise that the digital portion will inject into the common substrate. Thus, currently-existing programmable analog functions are expensive, specific to limited applications, and are mostly used for prototyping applications. Presently, existing programmable mixed mode integrated devices use pre-defined or pre-configured analog functions combined with a routing matrix that is suitable for digital signals to route the analog signals, and a digital programmable array similar to a PLD, FPGA, DSP, or Micro Controller function. The routing matrix uses CMOS pass gates to route and connect the analog signals between the analog functions. These metal oxide semiconductor (CMOS) pass gates, which are not suitable for passing analog signals with different frequencies and amplitudes limit the operating range of the analog functions and will also make it more prone to noise.

Therefore, there is a need in the art for a programmable mixed mode architecture that integrates analog and digital functions and resolves the noise issue injected by the digital portion.

SUMMARY

The present invention provides a new way of routing, mixing, or connecting the analog signal without limiting their performance. It also makes the analog functions programmable and re-configurable to various analog functions.

In one aspect of the invention, a mixed-mode integrated circuit system includes a plurality of analog input cells, a plurality of analog output cells, an analog interconnect array, and a programmable digital portion. The input cells are configured to program various analog functions. The output cells are configured to provide digital and/or analog outputs corresponding to the programmed analog functions. The interconnect array mixes and directs the programmed analog functions into signals indicative of the analog functions. The array selectively provides the signals to the plurality of analog output cells. In one embodiment, the programmable digital portion includes a programmable logic device, Field programmable Gate array, macrocells, and a Phase Lock Loop (PLL).

In another aspect of the invention, the analog portion includes a plurality of analog input cells, a plurality of analog output cells, and a current sensing array. The analog input cells provide a plurality of predefined analog functions. The analog output cells generate digital and/or analog signals corresponding to the predefined analog functions. The current sensing array converts predefined analog functions from the plurality of analog input cells into current signal, mixes and directs the current signal, converts the current signal into voltage signal, and selectively provides the voltage signal to the plurality of analog output cells.

Other features and advantages of the present invention should be apparent from the following description, which illustrates, by way of example, the principles of the invention.

DETAILED DESCRIPTION

In recognition of the above-stated problems associated with existing mixed-mode integrated circuit architectures, embodiments for re-configurable analog devices and functions are described. In particular, following exemplary embodiments integrate digital and analog functions with re-configurable digital and analog arrays into a mixed-mode integrated circuit architecture. The analog functions include analog input cells, analog output cells, and an analog interconnect current sensing matrix. Furthermore, the mixed mode architecture enables integration of various mixed-mode systems without separating analog circuits/functions from digital functions. Consequently, for purposes of illustration, and not for purposes of limitation, the exemplary embodiments of the invention are described in a manner consistent with such use, though clearly the invention is not so limited.

Figure 1:
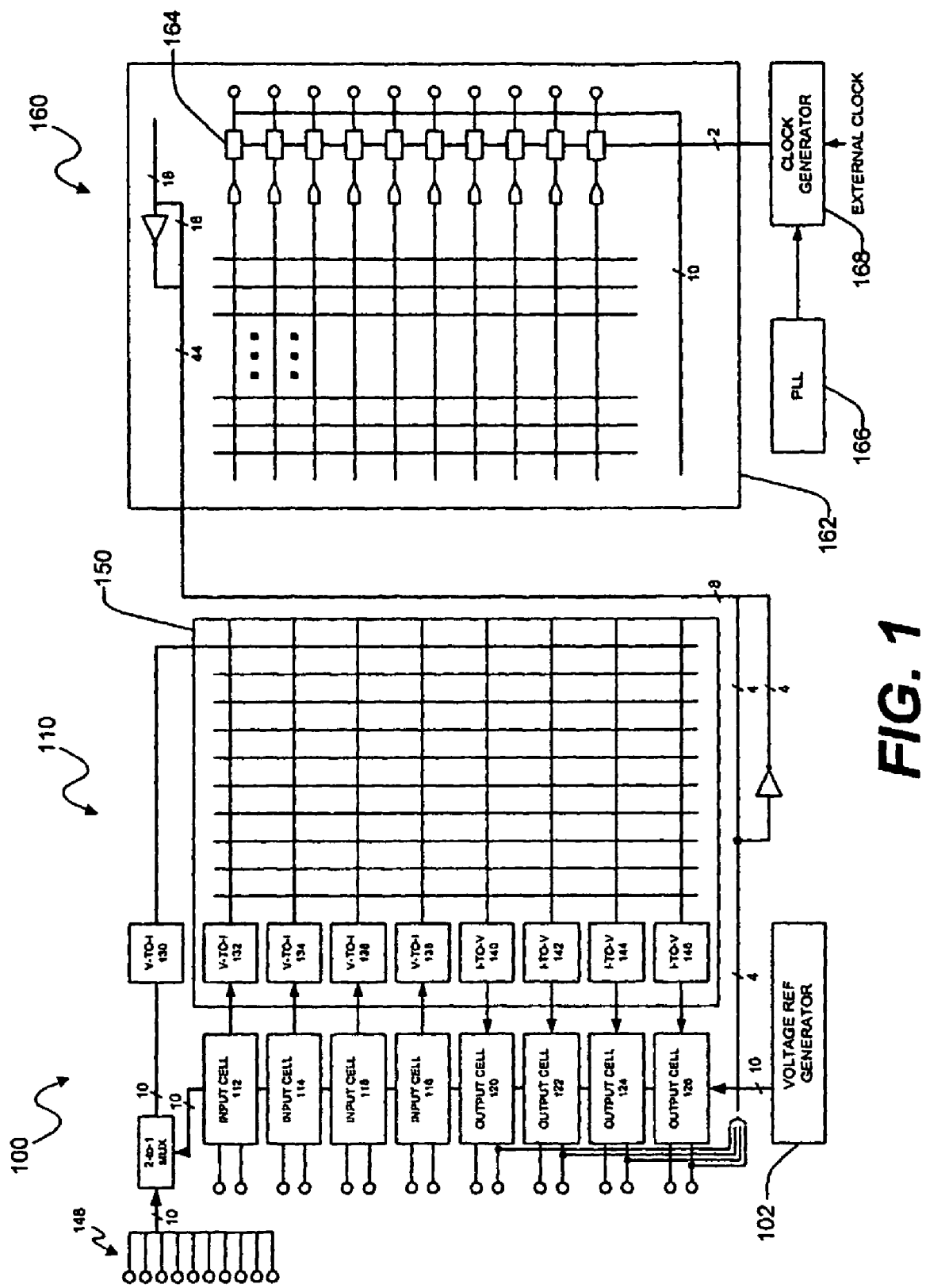
FIG. 1 illustrates a mixed-mode integrated circuit architecture in accordance with an exemplary embodiment of the present invention.

A mixed-mode integrated circuit architecture 100 in accordance with an exemplary embodiment of the present invention is illustrated in FIG. 1. In the exemplary embodiment, the mixed-mode architecture 100 includes an analog portion 110 and a digital portion 160. The analog portion 110 includes four re-configurable analog input cells 112-118, four programmable analog output cells 120-126, and a programmable analog interconnect current sensing array 150. However the analog portion 110 may be configured with any appropriate number of cells and/or current sensing arrays to implement the mixed-mode circuit in a similar design. The re-configurable analog input cell 112-118 enables programming of several analog functions using switches. The programmable analog output cell 120-126 processes the current output signal of the interconnect current sensing array 150 to a digital signal appropriate for interfacing with the digital array 162.

The analog portion 110 further includes programmable voltage reference generator 102 that generates voltage references, which are accessible to the re-configurable input/output cells 112-126 and direct analog input ports 148 coupled to the analog interconnect current sensing array 150. The direct analog input ports 148 are used to input analog signals that do not require processing by the analog input cells 112-118.

The digital portion 160 may include a programmable logic array 162, a phase lock loop (PLL) 166, a clock generator 168, and macro-cells 164 with digital inputs/outputs that meet various interfacing standards. In the exemplary embodiment, the programmable logic array 162 includes 44 input elements (22 non-inverted and 22 inverted input signals). Eight of the input elements are coupled to the analog output cells 120-126, and the other 36 input elements are coupled to 18 external digital input pins. However, the programmable logic array 162 may be implemented using the architecture similar to the conventional architecture of programmable logic devices (PLD), field programmable gate arrays (FPGA), and/or other similar architectures. PLL 166 receives a reference frequency from an oscillator that is multiplied and phase-lock looped by the PLL block to provide high clock frequency and synchronization of the signals in the macro-cells 164. In some embodiments, the PLL 166 may be multiplexed with an external clock in the clock generator 168 to enable operation of each output macro-cell 164 from a different clock source if desired. The clock generator 168 includes clock drivers and a multiplexer. The drivers receive the PLL output and drive the macrocells 164 of the programmable logic array 162. The multiplexer enables receipt of the clock signal from an external source by bypassing the PLL 166.

In an alternative embodiment, the programmable analog interconnect current sensing array 150 of the analog portion 110 is configured to operate with conventional pre-defined input and output cells. However, unlike the conventional design of the array, the interconnect array 150 of the alternative embodiment converts the output of the input cell from voltage to current so that crosstalk and noise coupling between different analog signals from different input cells are substantially reduced.

In a further embodiment, the analog input cells 112-118 and the analog output cells 120-126 of the analog portion operate in conjunction with a conventional design of the interconnect array. Hence, the output signal from the input cell is not converted from voltage to current, and the input signal to the output cell need not be converted to voltage. Although this configuration may introduce some crosstalk and noise coupling, the advantages of the programmability of the input and output cells can be realized.

Figure 2:
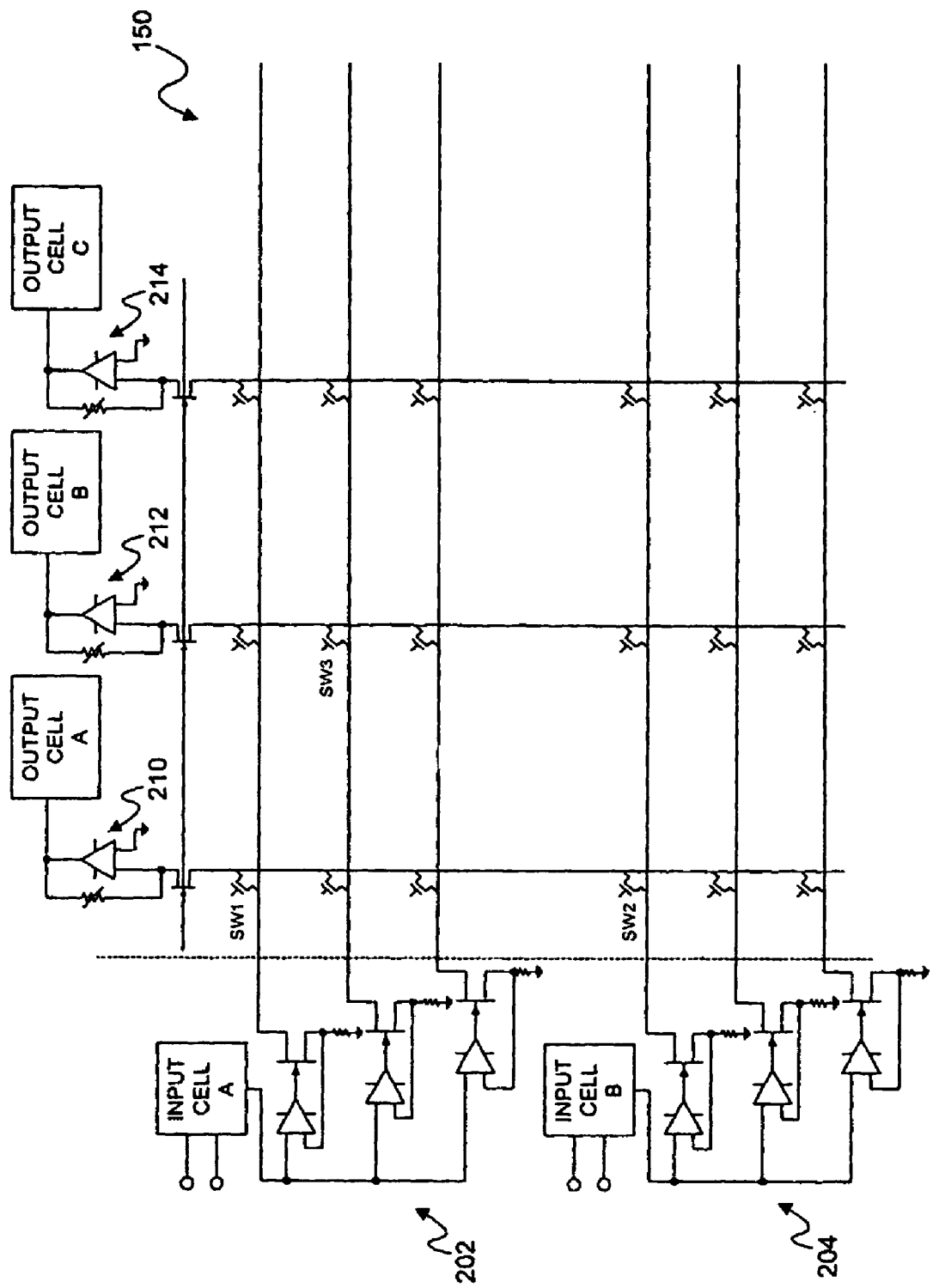
FIG. 2 illustrates a programmable analog current sensing interconnect array according to an exemplary embodiment of the present invention.

A programmable analog current sensing interconnect array 150 according to an exemplary embodiment of the present invention is shown in FIG. 2. The interconnect array 150 enables connection of the analog input cells 112-118 to the analog output cells 120-126. Signals from the analog input cells 112-118 representing the programmed analog functions are converted to current and directed to the desired output cells by programming the volatile/non-volatile configuration switches of the interconnect array 150. The processed signals are then transmitted to the analog output cell(s) 120-126 through an operational amplifier 210, 212, or 214 that acts as a current-to-voltage converter.

In the exemplary embodiment, a voltage-to-current converter circuit 202 in the interconnect array 150 converts the output signal from input cell A into current. This voltage-to-current converter circuit 202 includes operational amplifiers and transistor switches. Voltage-to-current converter 204 operates in similar manner with input cell B. Thus, by converting the analog signals from voltage into current, the analog interconnect array 150 substantially reduces crosstalk and noise coupling between different analog signals from different analog input cells.

The array 150 may also be used as a mixer for the different analog circuits/signals generated from two or more re-configurable analog input cells by operating the analog interconnect array 150 in a current mode. For example, by turning on both switches SW1 and SW2 in the same column as output cell A, the analog signals generated from the two re-configurable input cells (i.e., input cell A and input cell B) are mixed in current before being passed to the selected analog output cell (i.e., output cell A). The array may further be used as a splitter by directing a current signal into more than one output cell. For example, by turning on both switches SW1 and SW3, the analog signal generated from input cell A is directed into both output cell A and output cell B.

The analog interconnect array 150 also allows analog inputs that require no processing by the input cell to enter the analog array 150 through a voltage-to-current converter circuit. The converted analog inputs may then be mixed with other analog signals and directed to one or more analog output cells.

Figure 3:
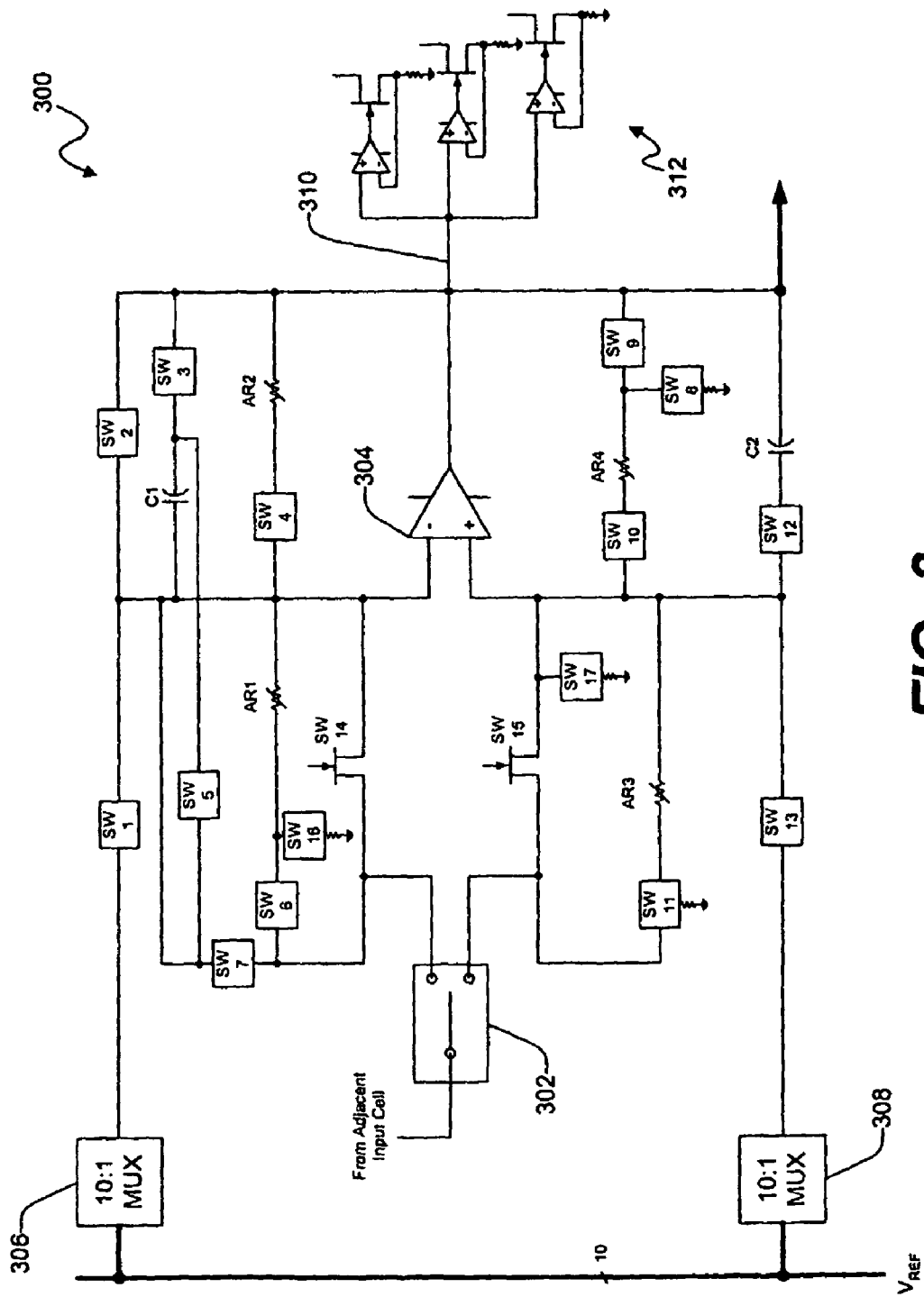
FIG. 3 is a schematic diagram of a re-configurable analog input cell according to an embodiment of the present invention.

FIG. 3 is a schematic diagram of a re-configurable analog input cell 300 according to an embodiment of the present invention. In the illustrated embodiment, the input cell 300 includes transistors SW14, SW15, capacitors C1, C2, adjustable resistors AR1-AR4, configuration switches SW1-SW17, and an operational amplifier 304. The configuration switches SW1-SW17 are controlled by volatile/non-volatile memory cells. The configuration switches may be selected or deselected to configure the input cell into desired analog functions.

Table 1 shows the configuration switches SW1-SW17 that may be turned on to generate the listed analog functions in accordance with an exemplary embodiment. For example, a unity gain non-inverting amplifier may be configured by turning on switches SW2 an SW14. Other analog circuits/functions, such as an integrator, a difference amplifier, a differentiator, a comparator, a reference voltage generator, a configurable/adjustable gain amplifier, and a current-to-voltage amplifier, may also be configured by turning on an appropriate combination of switches as listed in Table 1. The list, however, is provided for illustrative purposes only. Other circuits/functions can be generated using different combinations of configuration switches. For example, switches SW14 and SW15 may also be used to generate a sample-and-hold circuit.

TABLE 1

Re-configurable Analog Functions

| Functions | Configuration Switches |
| --- | --- |
| Unity Gain Amplifier | SW2, SW15 |
| Integrator | SW3, SW4, SW6, SW8, SW10 |
| Difference | SW4, SW6, SW9, SW10, SW11, SW7 |
| Differentiator | SW4, SW5, SW8, SW10 |
| Comparator | SW14, SW15 |
| Voltage Reference | SW2, SW13 |
| Gain Amplifier | SW4, SW15, SW16 |
| Current-to-Voltage Converter | SW4, SW14, SW17 |

Figure 4:
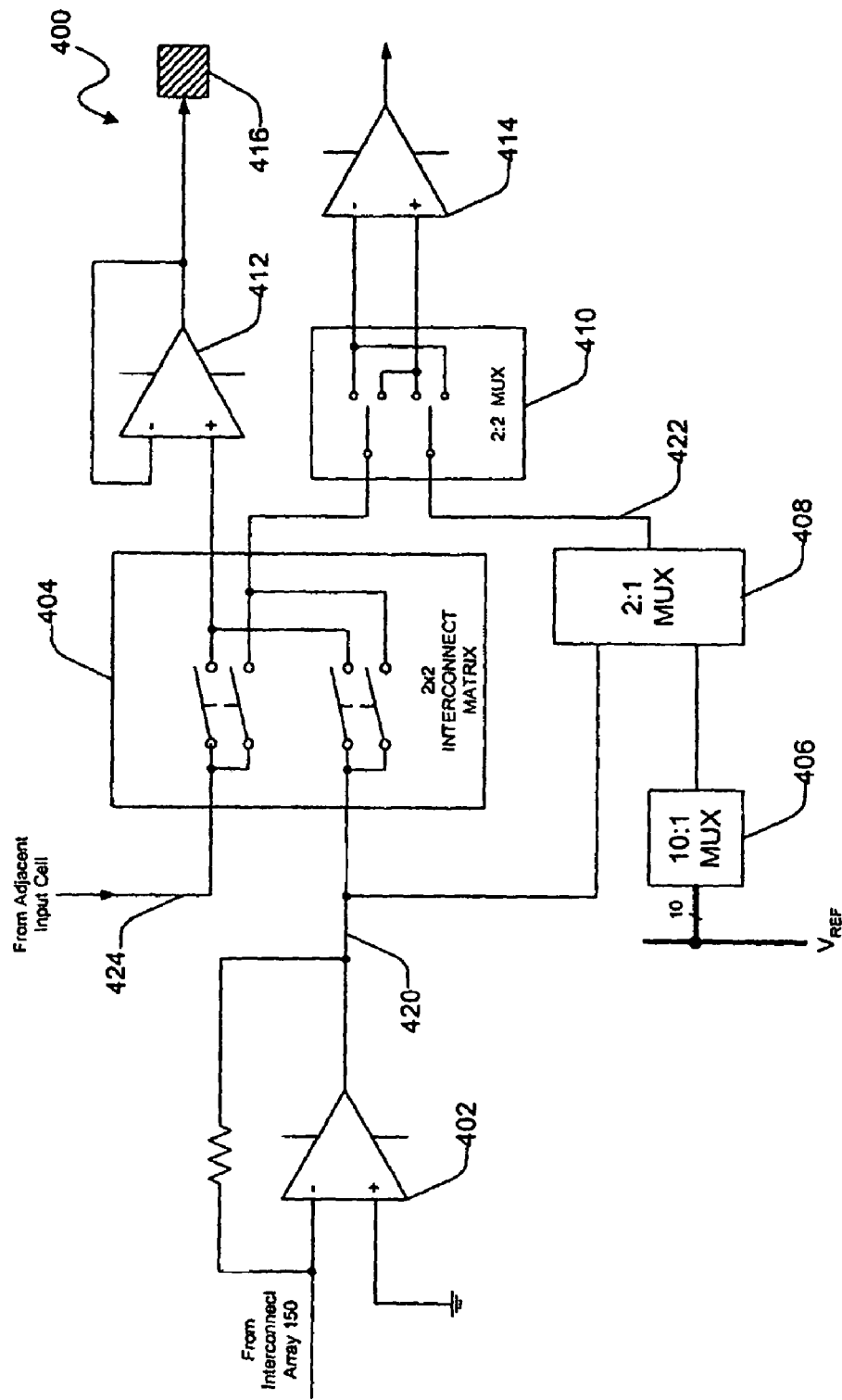
FIG. 4 is a schematic diagram of a programmable analog output cell according to an embodiment of the invention.

In the illustrated embodiment of FIG. 3, the output 310 of an analog input cell 300 is coupled to the interconnect array 50 through a voltage-to-current converter 312. However, the output 310 of the analog input cell 300 may also be coupled directly to the interconnection matrix 404 of the adjacent analog output cell 400 (i.e., bypass path to the output cell) and/or to the input multiplexer 302 of another analog input cell (i.e., bypass path to another input cell). Hence, by providing a bypass path from the input cell to the output cell, a direct analog input cell function translation may be made to the output without going through the analog interconnect array 150. Further, by providing a bypass path from the output of an input cell to the input of another input cell, programmability of the analog input cell 300 may be enhanced by cascading different or similar functional blocks. For example, if input cell A is configured as a gain amplifier with a gain of 10, and input cell B is configured also as a gain amplifier with a gain of 10, by cascading the two input cells, a gain amplifier with a gain of 100 can be achieved. Other functions such as filters may also be configured by cascading input cells FIG. 4 is a schematic diagram of a programmable analog output cell 400 according to an embodiment of the invention. In the illustrated embodiment, the output cell 400 includes a current-to-voltage converter 402, a 2×2 interconnect matrix 404, a 2:2 multiplexer 410, a 10:1 multiplexer 406, a 2:1 multiplexer 408, and an output comparator 414. The 2×2 interconnect matrix 404 directs the input signal (e.g., signal from the interconnect array 150 or directly from the input cell through the bypass path) to the analog output 416 and/or to the input multiplexer 410 of the output comparator 414. The 10:1 multiplexer 406 directs one of the 10 reference values into the 2:1 multiplexer 408, which is used to pass a reference voltage or the output of the operational amplifier 402 to the output comparator 414. The 2×2 multiplexer 410 directs the selected reference voltage and the selected input signal to the output comparator 414. Furthermore, the comparator 414 converts the analog signal into digital signal for interface with a digital array 162. The output comparator 414, in combination with the 2:2 multiplexer 410, can compare any combination between the operational amplifier output 420, the selected reference voltage 422, and the output 424 of the adjacent input cell. It should also be noted that the output cell 400 allows the input signal to be outputted as analog signal through an op-amp 412 to the analog output 416. This provides the architecture with the flexibility of being configured as providing analog functions and/or analog functions interfacing with digital functions. Sizes of the matrix and the multiplexers used in the exemplary embodiment are for illustrative purposes only. Hence, the sizes may be adjusted appropriately to configure the interface between the analog portion 110 and the digital portion 160 of the mixed-mode architecture 100.

There has been disclosed herein embodiments for re-configurable analog devices and functions used in a mixed-mode integrated circuit architecture 100. The analog devices include re-configurable analog input cells 112-118, programmable analog output cells 120-126, and a programmable interconnect array 150. The input cells 112-118 enable programming of a desired analog function using configuration switches SW1-SW17. The interconnect array 150 converts the output signal of the analog input cells 112-118 from voltage to current, and processes the converted signal(s) by mixing/splitting. Once the signal(s) has been processed, the interconnect array 150 converts the signal(s) from current to voltage, and directs the signal(s) to the output cell(s) 120-126. The output cells 120-126 enable routing of the signals to a comparator 414 for conversion to digital signal.

While specific embodiments of the invention have been illustrated and described, such descriptions have been for purposes of illustration only and not by way of limitation. The present invention should therefore not be seen as limited to the particular embodiment described herein, but rather, it should be understood that the present invention has wide applicability with respect to mixed-mode integrated circuit architecture generally. Throughout this detailed description, for the purposes of explanation, numerous specific details were set forth in order to provide a thorough understanding of the present invention. It will be apparent, however, to one skilled in the art that the embodiments may be practiced without some of these specific details. In other instances, well-known structures and functions were not described in elaborate detail in order to avoid obscuring the subject matter of the present invention. For example, although the details for implementing the programmable digital array are not provided herein, it is understood that conventional programmable arrays, such as programmable logic devices (PLD), field programmable gate arrays (FPGA); or even microprocessors, may be used. Accordingly, all modifications, variations, or equivalent arrangements and implementations that are within the scope of the attached claims should therefore be considered within the scope of the invention.

What is claimed is:

1. A circuit, comprising:
   an analog input cell including one or more switches and being configured to perform a first analog function or a second analog function according to setting defined for the one or more switches;
   a voltage-to-current converter configured to receive a first voltage signal from the analog input cell and output a first current signal;
   an analog interconnect array configured to receive the current signal output by the voltage-to-current converter, the analog interconnect array including a plurality of switches and configured to selectively steer, branch, and mix current signals including the first current signal received from the voltage-to-current converter; and
   a current-to-voltage converter configured to receive a second current signal output by the analog interconnect array and output a second voltage signal.

2. The circuit of claim 1, wherein the analog input cell is configured to perform the first analog function in a first time period.

3. The circuit of claim 2, wherein the analog input cell is reconfigured to perform the second analog function in a second time period.

4. The circuit of claim 1, wherein the circuit includes a plurality of analog input cells.

5. The circuit of claim 4, wherein the circuit includes a plurality of voltage-to-current converters and a plurality of current-to-voltage converters.

6. The circuit of claim 1, wherein the analog input cell is configured to function as a gain amplifier, the first analog function being amplifying an input signal.

7. The circuit of claim 1, wherein the analog input cell is configured to function as an integrator, the first analog function being integrating an input signal.

8. The circuit of claim 1, wherein the analog input cell is configured to function as a differentiator, the first analog function being differentiating an input signal.

9. The circuit of claim 1, wherein the analog input cell is configured to function as a differential amplifier, the first analog function being amplifying a difference between first and second input signals.

10. The circuit of claim 1, wherein the analog input cell is configured to function as a voltage adder, the first analog function being adding first and second input signals.

11. The circuit of claim 1, wherein the analog input cell is configured to function as a comparator, the first analog function being comparing first and second input signals.

12. The circuit of claim 1, wherein the analog input cell is configured to function as a current-to-voltage converter, the first analog function being converting an input current signal to an output voltage signal.

13. The circuit of claim 1, wherein the analog input cell is configured to function as a voltage reference, the first analog function being generating a substantially constant voltage as a reference voltage.

14. The circuit of claim 1, wherein the analog input cell includes a plurality of switches and the first and second analog functions are selected from the following analog functions: amplifying an input signal, integrating an input signal, differentiating an input signal, amplifying a difference between first and second input signals, adding first and second input signals, comparing first and second input signals, converting a current signal to a voltage signal, and generating a substantially constant voltage as a reference voltage.

15. The circuit of claim 1, wherein the analog interconnect array is configured to operate in a current domain.

16. The circuit of claim 1, wherein the one or more switches of the analog input cell are transistors.

17. A configurable analog input cell coupled to an analog interconnect matrix, the configurable analog input cell comprising:
  a circuit network including a plurality of switches, at least one resistor, and at least one capacitor;
  an operational amplifier coupled to the circuit network; and
  a multiplexer having first and second output terminals coupled, respectively, to first and second input terminals of the operational amplifier,
  wherein the circuit network provides a first mathematical function if the plurality of switches defines a first state and a second mathematical function if the plurality of switches defines a second state different, and
  wherein the analog input cell is coupled to the analog interconnect matrix via a voltage-to-current convertor of the analog interconnect matrix, the analog interconnect matrix operating in a current domain.

18. The configurable analog input cell of claim 17, wherein the first and second mathematical functions are selected from the following:
  amplification, integration, differentiation, addition, comparison, voltage-to-current conversion, and reference voltage generation.

19. The configurable analog input cell of claim 17, wherein the switches are transistors.

* * * * *